US011361690B2

(12) United States Patent
Zhang et al.

(10) Patent No.: US 11,361,690 B2
(45) Date of Patent: Jun. 14, 2022

(54) DISPLAY SUBSTRATE AND METHOD FOR DETECTING THE SAME, AND DISPLAY DEVICE (71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Taoran Zhang, Beijing (CN); Zailong Mo, Beijing (CN); Da Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 594 days.

(21) Appl. No.: 16/338,332

(22) PCT Filed: Nov. 8, 2018

(86) PCT No.: PCT/CN2018/114586
§ 371 (c)(1),
(2) Date: Mar. 29, 2019

(87) PCT Pub. No.: WO2019/184371
PCT Pub. Date: Oct. 3, 2019

(65) Prior Publication Data
US 2021/0366325 A1 Nov. 25, 2021

(30) Foreign Application Priority Data
Mar. 27, 2018 (CN) .......................... 201810258058.4

(51) Int. Cl.
G09G 3/00 (2006.01)
G09G 3/3291 (2016.01)
(Continued)

(52) U.S. Cl.
CPC ....... G09G 3/006 (2013.01); G02F 1/136286 (2013.01); G09G 3/00 (2013.01);
(Continued)

(58) Field of Classification Search
CPC .... G09G 3/006; G09G 3/3291; G09G 3/3688; G02F 1/136286; H01L 27/3276
See application file for complete search history.

(56) References Cited

U.S. PATENT DOCUMENTS 9,653,368 B2 * 5/2017 Kwak ................. H01L 27/3276
10,210,782 B2 * 2/2019 Lee ......................... G09G 3/006
(Continued)

FOREIGN PATENT DOCUMENTS

CN 112289837 A * 1/2021 ............. G09G 3/006
EP 2983157 A1 2/2016

OTHER PUBLICATIONS

Extended European Search Report dated Dec. 7, 2021 for application No. EP 18857435.4.

*Primary Examiner* — Sardis F Azongha
(74) *Attorney, Agent, or Firm* — Nath, Goldberg & Meyer; Joshua B. Goldberg (57) ABSTRACT Provided are a display substrate, a method for detecting the same and a display device. The display substrate includes a display area and a non-display area surrounding the display area, the display substrate further includes data lines extending from the display area to the non-display area, the non-display area is provided with at least one switching transistor, a first electrode of each switching transistor is coupled to one of the data lines, a second electrode of each (Continued)

switching transistor is coupled to a data voltage supply circuit, at least one crack detecting wire, corresponding to the at least one switching transistor in one-to-one correspondence, is provided in the display area, an end of the crack detecting wire is coupled to a control electrode of the switching transistor corresponding to the crack detecting wire, another end of the crack detecting wire is coupled to a switching voltage supply circuit.

20 Claims, 3 Drawing Sheets

(51) Int. Cl.
  *G09G 3/36* (2006.01)
  *G02F 1/1362* (2006.01)
  *H01L 27/32* (2006.01)

(52) U.S. Cl.
  CPC ......... *G09G 3/3291* (2013.01); *G09G 3/3688* (2013.01); *H01L 27/3276* (2013.01); *G09G 3/035* (2020.08); *G09G 2310/0272* (2013.01)

(56) References Cited

U.S. PATENT DOCUMENTS

| | | | |
|---|---|---|---|
| 10,605,855 B2* | 3/2020 | Wang | G01R 31/2621 |
| 11,120,714 B2* | 9/2021 | Lee | G09G 3/00 |
| 2008/0191213 A1 | 8/2008 | Bae et al. | |

* cited by examiner

DISPLAY SUBSTRATE AND METHOD FOR DETECTING THE SAME, AND DISPLAY DEVICE

CROSS-REFERENCE TO RELATED APPLICATION

This is a National Phase Applications filed under 35 U.S.C. 371 as a national stage of PCT/CN2018/114586, filed Nov. 8, 2018, an application claiming the benefit of Chinese Application No. 201810258058.4, filed Mar. 27, 2018, the disclosure of which is hereby incorporated by reference in its entirety.

TECHNICAL FIELD

The present disclosure relates to the field of display technology, and in particular, to a display substrate, a method for detecting the same, and a display device.

BACKGROUND

Currently, most of OLED flexible products adopt a design of crack detecting wire to perform a panel crack detect (PCD). In this design, a metal wire is provided to surround a circumference of display panel several turns and then coupled to data lines in a display area. In a case where the crack detecting wire breaks, a resistance of the crack detecting wire increases, causing insufficient writing of a data voltage on the data line connected thereto. For example, for a conventional pixel driving circuit of 7T1C, insufficiently writing of the data voltage may result in a number of bright lines in the display panel, depending on which a crack in a film layer can be detected.

SUMMARY

An embodiment of the present disclosure provides a display substrate including a display area and a non-display area surrounding the display area, the display substrate further including data lines extending from the display area to the non-display area, wherein the non-display area is provided with at least one switching transistor, a first electrode of each switching transistor is coupled to one of the data lines respectively, a second electrode of each switching transistor is coupled to a data voltage supply circuit, and at least one crack detecting wire, corresponding to the at least one switching transistor in one-to-one correspondence, is provided in the display area, one end of the crack detecting wire is coupled to a control electrode of a corresponding switching transistor, and the other end of the crack detecting wire is coupled to a switching voltage supply circuit.

In some implementations, in a case where performing a display failure detection, the switching voltage supply circuit is configured to output a first switching voltage, and the data voltage supply circuit is configured to output a first data voltage, so that the switching transistor operates in a linear region.

In some implementations, in the case where performing a crack detection, the switching voltage supply circuit is configured to output a second switching voltage, and the data voltage supply circuit is configured to output a second data voltage, so that the switching transistor operates in a saturation region.

In some implementations, a pixel driving circuit is provided in the display area, the pixel driving circuit including a driving transistor, in a case where performing a crack detection, a second electrode of the driving transistor is coupled to a first power supply voltage, so that the driving transistor operates in a saturation region.

In some implementations, the crack detecting wire is provided to surround the display area.

In some implementations, the crack detecting wire surrounds the display area 2 or 3 turns.

In some implementations, the display substrate further including a gate line, and the crack detecting wire is provided in a same layer as the gate line, and is made of a same material as the gate line.

In some implementations, a material of the crack detecting wire includes molybdenum.

In some implementations, the switching transistor includes a P-type transistor.

In some implementations, the display substrate including an LCD array substrate or an OLED array substrate.

An embodiment of the present disclosure provides a method for detecting the above display substrate, including a display fault detection stage and a crack detection stage, wherein in the display fault detection stage, controlling a switching voltage supply circuit to output a first switching voltage to a control electrode of the switching transistor; and controlling a data voltage supply circuit to output a first data voltage to a second electrode of the switching transistor so that the switching transistor operates in a linear region, so as to detect whether there is a defect in the display of the display substrate;

in the crack detection stage, controlling the switching voltage supply circuit to output a second switching voltage to the control electrode of the switching transistor, and controlling the data voltage supply circuit to output a second data voltage to the second electrode of the switching transistor, so that the switching transistor operates in a saturation region, so as to detect whether there is a crack in the crack detecting wire.

In some implementations, the display area is provided with a pixel driving circuit, and the pixel driving circuit includes a driving transistor, and the crack detection stage further includes:

supplying a first power supply voltage to the second electrode of the driving transistor, so that the driving transistor operates in the saturation region.

An embodiment of the present disclosure provides a display device including the above display substrate.

DETAILED DESCRIPTION

To enable those skilled in the art to better understand the technical solutions of the present disclosure, the present disclosure will be further described in detail below in conjunction with the drawings and specific embodiments.

With the continuous improvement of product resolution (PPI: pixels per inch) and the popularity of full-screen, a space for arranging a detection switch in the display panel is becoming narrower and narrower. Currently, the single-sided switch is frequently used to perform Cell Test (that is, undesirable-display detection) on a display panel. For the PCD, there are no more switches available for controlling the PCD, resulting in that the PCD cannot be turned off during the Cell Test of the display product. Due to the resistance of the crack detecting wire for the PCD, the data voltage signal coupled to the crack detecting wire has a significant voltage drop, the writing of the data voltage is insufficient, and a bright line or a dark line may appear in different circuits, which causes the Cell Test process being affected by a vertical line PCD-X-Line, the normal undesirable-product detection is affected and excessive test and misjudgment may occur, affecting product quality and yield.

Figure 1:
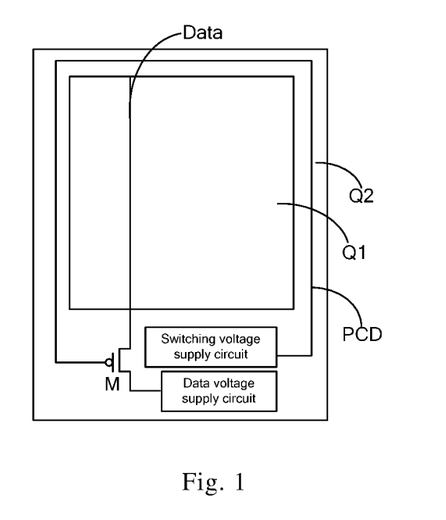
FIG. 1 is a structural diagram of a display substrate according to an embodiment of the present disclosure.
Figure 2:
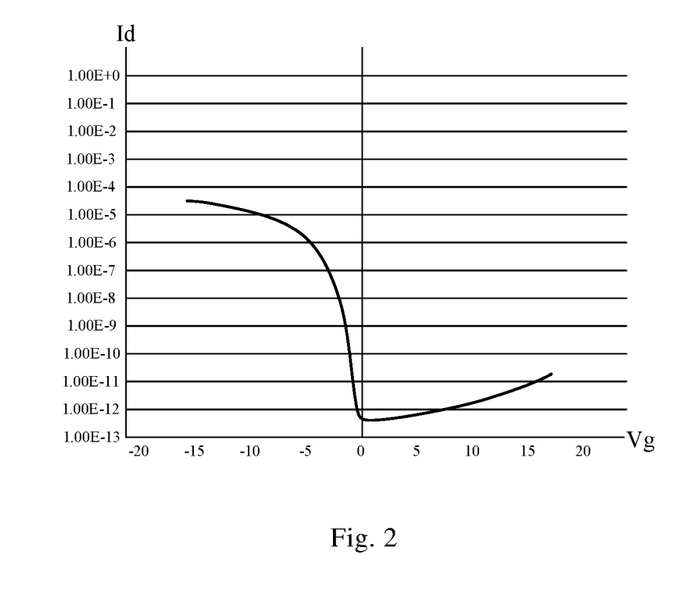
FIG. 2 is a circuit diagram of a display substrate according to an embodiment of the present disclosure.

As described in FIG. 1, an embodiment of the present disclosure provides a display substrate including a display area Q1 and a non-display area Q2 surrounding the display area Q1. The display substrate further includes: a data line Data extending from the display area Q1 to the non-display area Q2; a switching transistor and a crack detecting line provided in the non-display area Q2; wherein an end of the crack detecting wire is coupled to a control electrode of the switching transistor, and another end of the crack detecting wire is coupled to a switching voltage supply circuit; a first electrode of the switching transistor is coupled to the data line Data, and a second electrode of the switching transistor is coupled to a data voltage supply circuit. In an undesirable-display detection stage, the switching voltage supply circuit is configured to output a first switching voltage, the data voltage supply circuit is configured to output a first data voltage, and the switching transistor operates in a linear region; and in a crack detection stage, the switching voltage supply circuit is configured to output a second switching voltage, the data voltage supply circuit is configured to output a second data voltage, and the switching transistor operates in a saturation region.

In the present embodiment, the description will be made by taking each of the transistors in the display substrate being a P-type transistor as an example, and the first electrode of the transistor is a drain, the second electrode of the transistor is a source, and the control electrode of the transistor is a gate. The linear region of the switching transistor in the present embodiment is located near Ion of the Id-Vg characteristic curve of the switching transistor, and the saturation region of the switching transistor is located near the sub-threshold value of the Id-Vg characteristic curve of the switching transistor.

In the present embodiment, in a case where the display substrate is subjected to the undesirable-display detection, the switching voltage supply circuit outputs the first switching voltage to the control electrode of the switching transistor through the crack detecting wire, and the data voltage supply circuit outputs the first data voltage to the drain of the switching transistor, and the switching transistor operates in a linear region during this stage. Therefore, changes in voltage of the gate of the switching transistor would not affect a change in source-drain current of the switching transistor, that is, even if the crack detecting wire breaks during the undesirable-display detection stage, the resistance of the crack detecting wire changes from 1Ω to 1 MΩ, and a change in voltage of the control electrode of the switching transistor occurs, the current output from the drain of the switching transistor to the data line Data cannot be affected, that is, the undesirable-display detection of the display substrate cannot be affected. It can be seen that the switching transistor being controlled to operate in the linear region is equivalent to shielding the crack detecting wire. Correspondingly, when the display substrate of the present embodiment is subjected to the crack detection, the switching voltage supply circuit outputs a second switching voltage to the control electrode of the switching transistor through the crack detecting wire, and the data voltage supply circuit outputs the second data voltage to the drain of the switching transistor, and the switching transistor operates in a saturation region during this stage. Therefore, a small change in the voltage of the gate of the switching transistor can cause a large change in the source-drain current of the switching transistor, thus, as long as the crack detecting wire breaks, its resistance changes, the voltage applied to the gate of the switching transistor changes, resulting in a large change in the source-drain current of the switching transistor, that is, the switching transistor operating in the saturation region is equivalent to an amplifying circuit of the crack detecting wire, so that the crack detection may be more accurate.

The display area Q1 of the display substrate of the present embodiment is provided with a pixel driving circuit therein, and the pixel driving circuit may be a pixel driving circuit of 2T1C, that is, the pixel driving circuit includes two transistors and one storage capacitor Cst; or the pixel driving circuit may be a pixel driving circuit of 7T1C, that is, the pixel driving circuit includes seven transistors and a storage capacitor Cst. A specific circuit structure for realizing the crack detection and undesirable-display detection in the display substrate of the present disclosure will be described below with reference to FIG. 3, in which the connection relationship and operation principle of the related pixel driving circuit of 7T1C, the switching transistor M and the crack detecting wire are mainly described.

Figure 3:
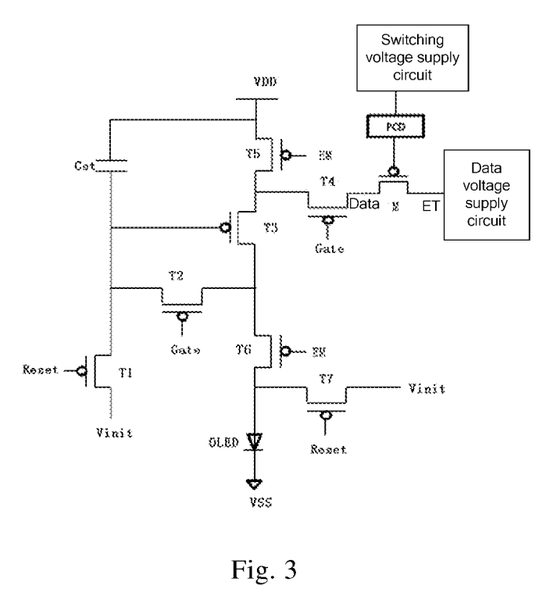
FIG. 3 is a schematic diagram of an Id-Vg curve of a P-type transistor.

As shown in FIG. 3, each of the transistors in the pixel driving circuit of 7T1C and the switching transistor M employs a P-type transistor. A third transistor T3 is a driving transistor, and a fourth transistor T4 is a scanning transistor.

Specifically, a first electrode of a first transistor T1 is coupled to a signal input terminal Vinit, a source of the first transistor T1 is coupled to a drain of a second transistor T2 and a control electrode of a third transistor T3, and a control electrode of the first transistor T1 is coupled to a reset signal terminal Reset. The drain of the second transistor T2 is coupled to the source of the first transistor T1 and the control electrode of the third transistor T3, a source of the second transistor T2 is coupled to a drain of the third transistor T3 and a source of a sixth transistor T6, and a control electrode of the second transistor T2 is coupled to a gate line Gate. The drain of the third transistor T3 is coupled to the source of the second transistor T2 and the source of the sixth transistor T6, and a source of the third transistor T3 is coupled to a drain of the fifth transistor T5 and a drain of a fourth transistor T4, and the control electrode of the third transistor T3 is coupled to a first end of the capacitor Cst and the drain of the second transistor T2. The drain of the fourth transistor T4 is coupled to the drain of the fifth transistor T5 and the source of the third transistor T3, and a source of the fourth transistor T4 is coupled to the data line Data and in turn coupled to a drain of the switching transistor M, a control electrode of the fourth transistor T4 is coupled to the gate line Gate. The drain of the fifth transistor T5 is coupled to the source of the third transistor T3 and the drain of the fourth transistor T4, and a source of the fifth transistor T5 is coupled to a first power supply voltage terminal and a second end of the storage capacitor Cst, a control electrode of the fifth transistor T5 is coupled to a light-emitting control line EM. A drain of a sixth transistor T6 is coupled to a drain of a seventh transistor T7 and a drain of a light-emitting device OLED, a source of sixth transistor T6 is coupled to the source of the second transistor T2 and the drain of the third transistor T3, an control electrode of sixth transistor T6 is coupled to the light-emitting control line EM. The drain of the seventh transistor T7 is coupled to the drain of the sixth transistor T6 and the drain of the light-emitting device OLED, and a source of the seventh transistor T7 is coupled to the signal input terminal Vinit, and a control electrode of the seventh transistor T7 is coupled to a reset signal terminal Reset. A source of the light-emitting device OLED is coupled to a second power voltage terminal. The drain of the switching transistor M is coupled to the data line Data, a source of the switching transistor M is coupled to the data voltage supply circuit, and a control electrode of the switching transistor M is coupled to an end of the crack detecting wire, another end of the crack detecting wire is coupled to a switching voltage supply circuit.

In the present embodiment, the scanning transistor (the fourth transistor) T4 is configured to control whether the pixel driving circuit is gated, and the driving transistor (the third transistor) T3 is configured to supply a driving current to the light-emitting device after the switching transistor M is turned on. As described above, the source of the driving transistor T3 is coupled to the first power supply voltage terminal through the fifth transistor. In the embodiment, in the crack detection stage, the driving transistor operates in the saturation region due to the first power supply voltage from the first power supply voltage terminal. In this way, both the driving transistor and the switching transistor M are in the sub-threshold swing (SS) section during the crack detection stage, and a small change in the gate-source voltage may cause a significant influence on the source-drain current, and since the data line Data is coupled to the crack detecting wire through the switching transistor M, a rate of writing the second data voltage to the data line Data is significantly lowered. At this time, the power supply voltage applied to the gate of the driving transistor is adjusted to increase the gate-source voltage of the driving transistor, therefore it can quickly and accurately determine whether the crack detecting wire is abnormal by detecting the change in the resistance of the crack detecting wire.

Figure 4:
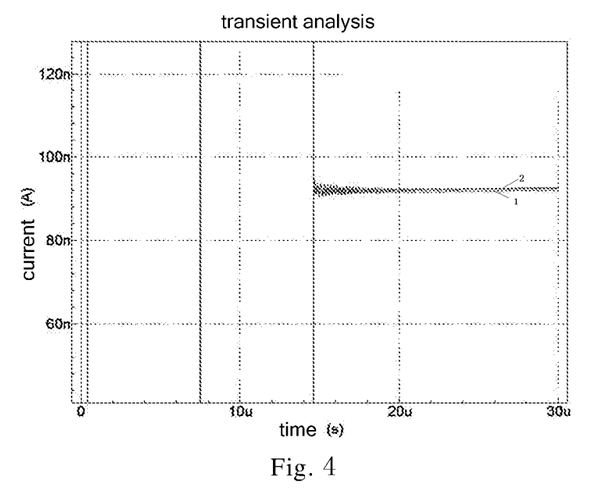
FIG. 4 shows an influence of changes in a resistance of a crack detecting wire on a current of a light emitting device in an undesirable-display detection stage, according to an embodiment of the present disclosure.

Specifically, description will be made by taking the switching transistor M adopting a P-type transistor and detecting whether a green pixel displays normally in the undesirable-display detection stage as an example. A first data voltage of 7 V output from the data voltage supply circuit is output to the drain of the switching transistor M through the ET signal line and is finally input to the data line Data. At this time, the gate-source voltage of the switching transistor M ranges from −7V to −13V, and the switching transistor M operates in the linear region. In this case, fluctuation of the voltage of the gate of the switching transistor M has no significant influence on the output of the source-drain current, the simulation results are shown in FIG. 4. As can be seen from FIG. 4, when the resistance of the crack detecting wire is 1Ω or 1 MΩ, the currents output to the light emitting device OLED are almost the same, and in the undesirable-display detection stage, no display defect, such as typical horizontal stripes due to breakage of the crack detecting wire, appears on the display panel, therefore, the normal undesirable-display detection cannot be affected, and the effect of shielding the amplifying circuit is achieved.

Figure 5:
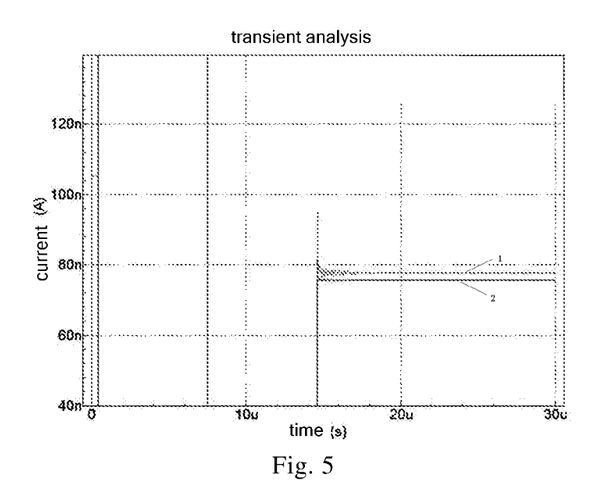
FIG. 5 shows an influence of changes in a resistance of a crack detection wire on a current of a light emitting device in a crack detection stage, according to an embodiment of the present disclosure.

The numeral 1 in the drawing represents a current change curve in a case where the resistance of the crack detecting wire is 1Ω, and the numeral 2 represents a current change curve in a case where the resistance of the crack detecting wire is 1 MΩ, and FIG. 5 is similar.

In the crack detection stage, the second switching voltage written to the gate of the switching transistor M is adjusted to about 2.5V, and the second data voltage written to the source of the switching transistor M is adjusted to about 4V, at this time, the gate-source voltage of the switching transistor M is 1.5V. Since Vgs equals to 1.5V, the switching transistor M operates in the normal PMOS sub-threshold swing (SS) section, and the influence of small change in Vgs on the current is obvious, and since the efficiency of writing the second data voltage is decreased significantly, the first power supply voltage Vdd received by the source of the driving transistor in the pixel circuit is adjusted to 0.1V, the Vgs of the driving transistor is increased, and the driving transistor also operates in the SS section, therefore it can quickly and accurately determine whether the crack detecting wire is abnormal by detecting the change in the resistance of the crack detecting wire. As shown in the simulation results in FIG. 5, when the resistance of the crack detecting wire changes from 1Ω to 1 MΩ, the current output from the light-emitting device OLED changes significantly. As the change of the resistance of the crack detecting wire intensifies, the output current of the light-emitting device OLED changes more obviously. By adjusting amplitude of the Vdd, adjusting the operation region of the driving transistor, and adjusting the sensitivity to the change in the resistance of the crack detecting wire, it is possible to effectively determine whether the crack detecting wire is broken.

In the present embodiment, the crack detecting wire is provided in the non-display area Q2, and the crack detecting wire is provided to surround the display area Q1. Such an arrangement does not affect the aperture ratio of the display area Q1 of the display substrate, and also does not affect the signal transmission in the display area Q1.

In some embodiments, the crack detecting wire has a length capable of surrounding the display area 2-3 turns. Certainly, the length of the crack detecting wire may be specifically set according to the size of the display substrate. The crack detecting wire is provided in a same layer as the gate line Gate in the display substrate, and is made of a same material as the gate line Gate. It should be noted that providing in the same layer may represent that layer structures are located at a same horizontal plane, or have a step difference therebetween. In this way, the crack detecting wire can be formed while forming the gate line Gate in the display substrate, therefore no additional process step is increased and the cost is not increased. Specifically, the material of the crack detecting wire may be a material having a good electrical conductivity, such as molybdenum.

It should be understood that the present disclosure has been described by taking one switching transistor, one crack detecting wire, one data line, one switching voltage supply circuit, and one data voltage supply circuit as an example with reference to the accompanying drawings, but this is merely exemplary, but not limited. A person skilled in the art may provide a plurality of switching transistors, a plurality of data lines, and a plurality of crack detecting wires according to actual applications, wherein the plurality of switching transistors are coupled to the plurality of crack detecting wires respectively in one-to-one correspondence, and at this time, one switching voltage supply circuit and one data voltage supply circuit may be respectively coupled to the plurality of switching transistors. Furthermore, depending on actual applications, a plurality of switching voltage supply circuits and a plurality of data voltage supply circuits may be provided such that each kind of them are coupled to the switching transistors respectively in a one-to-one correspondence.

The display substrate in the present embodiment may be an LCD array substrate in a liquid crystal panel, or may be an OLED array substrate in an OLED display device. In the present embodiment, description is made by taking the display substrate being an OLED array substrate as an example.

An embodiment of the present disclosure further provides a method for detecting a display substrate, and the display substrate may be the aforementioned display substrate. The method for detecting the display substrate includes two stages, that is, an undesirable-display detection stage and a crack detection stage.

In the undesirable-display detection stage, controlling the switching voltage supply circuit to output the first switching voltage to the control electrode of the switching transistor; controlling the data voltage supply circuit to output the first data voltage to the source of the switching transistor, so that the switching transistor operates in a linear region to detect whether or not the display of the display substrate is defective.

In the crack detection stage, controlling the switching voltage supply circuit to output the second switching voltage to the control electrode of the switching transistor; controlling the data voltage supply circuit to output the second data voltage to the source of the switching transistor so that the switching transistor operates in the saturation region to detect whether there is a crack in the crack detecting wire.

In the present embodiment, in a case where the display substrate is subjected to the undesirable-display detection, the switching voltage supply circuit outputs the first switching voltage to the control electrode of the switching transistor through the crack detecting wire, and the data voltage supply circuit outputs the first data voltage to the drain of the switching transistor through the data line Data, and the switching transistor operates in a linear region during this stage. Therefore, changes in the voltage of the gate of the switching transistor does not affect the change in the source-drain current of the switching transistor, that is, even if the crack detecting wire breaks during the undesirable-display detection stage, the resistance of the crack detecting wire changes from 1Ω to 1 MΩ, resulting in a change in the voltage of the control electrode of the switching transistor, the current output from the drain of the switching transistor to the data line Data cannot be affected, that is, the undesirable-display detection of the display substrate cannot be affected. It can be seen that the switching transistor is controlled to operate in the linear region, which is equivalent to shielding the crack detecting wire.

Correspondingly, in a case where the display substrate of the present embodiment is subjected to the crack detection, the switching voltage supply circuit outputs a second switching voltage to the control electrode of the switching transistor through the crack detecting wire, and the data voltage supply circuit outputs the second data voltage to the drain of the switching transistor through the data line Data, and the switching transistor operates in a saturation region during this stage. Therefore, a small change in the voltage of the gate of the switching transistor can cause a large change in the source-drain current of the switching transistor, as long as the crack detecting wire breaks, its resistance changes, the voltage applied to the gate of the switching transistor changes, resulting in a large change in the source-drain current of the switching transistor, that is, the switching transistor operating in the saturation region is equivalent to an amplifying circuit of the crack detecting wire, thus the crack detection may be more accurate.

The display substrate in the present embodiment further includes a pixel driving circuit. The pixel driving circuit may be a pixel driving circuit of 2T1C or a pixel driving circuit of 7T1C. Certainly, the pixel driving circuit may be a pixel driving circuit of other structure. In some embodiments, the crack detection stage further includes: applying the first power supply voltage, so that the driving transistor operates in the saturation region. In this way, both the driving transistor and the switching transistor M operate in the sub-threshold swing (SS) section during the crack detection stage, and a small change in the gate-source voltage may cause a significant influence on the source-drain current, and since the data line Data is coupled to the crack detecting wire through the switching transistor M, a rate of writing the second data voltage to the data line Data is significantly lowered. At this time, the power supply voltage applied to the gate of the driving transistor is adjusted to increase the gate-source voltage of the driving transistor, therefore it can quickly and accurately determine whether the crack detecting wire is abnormal by detecting the change in the resistance of the crack detecting wire.

Specifically, description will be made by taking the switching transistor M adopting a P-type transistor and detecting whether a green pixel displays normally in the undesirable-display detection stage as an example. A first data voltage of 7 V output from the data voltage supply circuit is output to the drain of the switching transistor M through the ET signal line and is finally input to the data line Data. At this time, the gate-source voltage of the switching transistor M ranges from −7V to −13V, and the switching transistor M operates in the linear region. In this case, fluctuation of the voltage of the gate of the switching transistor M has no significant influence on the output of the source-drain current, the simulation results are shown in FIG. 4. As can be seen from FIG. 4, when the resistance of the crack detecting wire is 1Ω and 1 MΩ, the currents output to the light emitting device OLED are almost the same, and in the undesirable-display detection stage, no display defect, such as typical horizontal stripes due to breakage of the crack detecting wire, appears on the display panel, therefore, the normal undesirable-display detection cannot be affected, and the effect of shielding the amplifying circuit is achieved.

In the crack detection stage, the second switching voltage written to the gate of the switching transistor M is adjusted to about 2.5V, and the second data voltage written to the source of the switching transistor M is adjusted to about 4V, at this time, the gate-source voltage of the switching transistor M is 1.5V. Since Vgs equals to 1.5V, the switching transistor M operates in the normal PMOS sub-threshold swing (SS) section, and the influence of small change in Vgs on the current is obvious, and since the efficiency of writing the second data voltage is decreased significantly, the first power supply voltage Vdd received by the source of the driving transistor in the pixel circuit is adjusted to 0.1V, the Vgs of the driving transistor is increased, so that the driving transistor also operates in the SS section, therefore it can quickly and accurately determine whether the crack detecting wire PCD is abnormal by the change in the resistance of the crack detecting wire is abnormal. As shown in the simulation results in FIG. 5, when the resistance of the crack detecting wire changes from 1Ω to 1 MΩ, the current output from the light-emitting device OLED changes significantly. As the change of the resistance of the crack detecting wire intensifies, the output current of the light-emitting device OLED changes more obviously. By adjusting amplitude of the Vdd, adjusting the operation region of the driving transistor, so as to adjust the sensitivity to the change in the resistance of the crack detecting wire, it is possible to effectively determine whether the crack detecting wire is broken.

An embodiment of the present disclosure provides a display device including the display substrate in the foregoing embodiments.

Therefore, the detection of the display device of the present embodiment is more accurate.

The display device may be a liquid crystal display device or an light-emitting display device, for example, a product or component having display function, such as a liquid crystal panel, an electronic paper, an OLED panel, a mobile phone, a tablet computer, a television, a display, a notebook computer, a digital photo frame, a navigator, and so on.

The present disclosure has the following beneficial effects.

When the display substrate in the present embodiment is subjected to the undesirable-display detection, the switching voltage supply circuit outputs the first switching voltage to the control electrode of the switching transistor through the crack detecting wire, and the data voltage supply circuit outputs the first data voltage to the drain of the switching transistor through the data line, and the switching transistor operates in a linear region during this stage. Therefore, changes in the voltage of the gate of the switching transistor would not affect the change of the source-drain current of the switching transistor. Correspondingly, when the display substrate of the present disclosure is subjected to the crack detection, the switching voltage supply circuit outputs the second switching voltage to the control electrode of the switching transistor through the crack detecting wire, and the data voltage supply circuit outputs the second data voltage to the drain of the switching transistor through the data line, and the switching transistor operates in a saturated region during this stage. Therefore, a small change in the voltage of the control electrode of the switching transistor may result in a large change in the source-drain current of the switching transistor. In this way, if the crack detecting wire breaks, the resistance of the crack detecting wire changes, and the voltage applied to the gate of the switching transistor changes, resulting in a large change in the source-drain current of the switching transistor, i.e. the switching transistor operating in the saturation region is equivalent to an amplifying circuit of the crack detecting wire, so that the crack detecting is more accurate.

It should be understood that, the foregoing embodiments are only exemplary embodiments used for explaining the principle of the present disclosure, but the present disclosure is not limited thereto. Various variations and modifications may be made by a person skilled in the art without departing from the spirit and essence of the present disclosure, and these variations and modifications also fall into the protection scope of the present disclosure.

The invention claimed is:

1. A display substrate, comprising a display area and a non-display area surrounding the display area, the display substrate further comprising data lines extending from the display area to the non-display area, wherein the non-display area is provided with at least one switching transistor, a first electrode of each switching transistor is coupled to one of the data lines, a second electrode of each switching transistor is coupled to a data voltage supply circuit, and at least one crack detecting wire, corresponding to the at least one switching transistor in one-to-one correspondence, is provided in the non-display area, an end of the crack detecting wire is coupled to a control electrode of the switching transistor corresponding to the crack detecting wire, and another end of the crack detecting wire is coupled to a switching voltage supply circuit.

2. The display substrate according to claim 1, wherein in a case where performing an undesirable-display detection, the switching voltage supply circuit is configured to output a first switching voltage, and the data voltage supply circuit is configured to output a first data voltage, and the switching transistor operates in a linear region.

3. A method for detecting a display substrate according to claim 2, comprising an undesirable-display detection stage and a crack detection stage, wherein
in the undesirable-display detection stage, controlling the switching voltage supply circuit to output a first switching voltage to the control electrode of the switching transistor; and controlling the data voltage supply circuit to output a first data voltage to the second electrode of the switching transistor so that the switching transistor operates in a linear region, so as to detect whether there is a defect in the display of the display substrate;
in the crack detection stage, controlling the switching voltage supply circuit to output a second switching voltage to the control electrode of the switching transistor, and controlling the data voltage supply circuit to output a second data voltage to the second electrode of the switching transistor, so that the switching transistor operates in a saturation region, so as to detect whether there is a crack in the crack detecting wire.

4. The method according to claim 3, wherein the display area is provided with a pixel driving circuit therein, and the pixel driving circuit comprises a driving transistor, and the crack detection stage further comprises:
supplying a first power supply voltage to the second electrode of the driving transistor, so that the driving transistor operates in the saturation region.

5. A display device, comprising the display substrate according to claim 2.

6. The display substrate according to claim 1, wherein, in a case where performing a crack detection, the switching voltage supply circuit is configured to output a second switching voltage, and the data voltage supply circuit is configured to output a second data voltage, and the switching transistor operates in a saturation region.

7. The display substrate according to claim 6, wherein a pixel driving circuit is provided in the display area, the pixel driving circuit comprising a driving transistor, in a case where performing the crack detection, a second electrode of the driving transistor is coupled to a first power supply voltage, and the driving transistor operates in a saturation region.

8. A method for detecting a display substrate according to claim 7, comprising an undesirable-display detection stage and a crack detection stage, wherein
in the undesirable-display detection stage, controlling the switching voltage supply circuit to output a first switching voltage to the control electrode of the switching transistor; and controlling the data voltage supply circuit to output a first data voltage to the second electrode of the switching transistor so that the switching transistor operates in a linear region, so as to detect whether there is a defect in the display of the display substrate;
in the crack detection stage, controlling the switching voltage supply circuit to output a second switching voltage to the control electrode of the switching transistor, and controlling the data voltage supply circuit to output a second data voltage to the second electrode of the switching transistor, so that the switching transistor operates in a saturation region, so as to detect whether there is a crack in the crack detecting wire.

9. The method according to claim 8, wherein the display area is provided with a pixel driving circuit therein, and the pixel driving circuit comprises a driving transistor, and the crack detection stage further comprises:
supplying a first power supply voltage to the second electrode of the driving transistor, so that the driving transistor operates in the saturation region.

10. A method for detecting a display substrate according to claim 6, comprising an undesirable-display detection stage and a crack detection stage, wherein
in the undesirable-display detection stage, controlling the switching voltage supply circuit to output a first switching voltage to the control electrode of the switching transistor; and controlling the data voltage supply circuit to output a first data voltage to the second electrode of the switching transistor so that the switching transistor operates in a linear region, so as to detect whether there is a defect in the display of the display substrate;
in the crack detection stage, controlling the switching voltage supply circuit to output a second switching voltage to the control electrode of the switching transistor, and controlling the data voltage supply circuit to output a second data voltage to the second electrode of the switching transistor, so that the switching transistor operates in a saturation region, so as to detect whether there is a crack in the crack detecting wire.

11. The method according to claim 10, wherein the display area is provided with a pixel driving circuit therein, and the pixel driving circuit comprises a driving transistor, and the crack detection stage further comprises:
supplying a first power supply voltage to the second electrode of the driving transistor, so that the driving transistor operates in the saturation region.

12. The display substrate according to claim 1, wherein the crack detecting wire is provided to surround the display area.

13. The display substrate according to claim 12, wherein the crack detecting wire surrounds the display area 2 or 3 turns.

14. The display substrate according to claim 1, wherein the display substrate further comprising a gate line, and the crack detecting wire is provided in a same layer as the gate line, and is made of a same material as the gate line.

15. The display substrate according to claim 1, wherein a material of the crack detecting wire comprises molybdenum.

16. The display substrate according to claim 1, wherein the switching transistor comprises a P-type transistor.

17. The display substrate according to claim 1, wherein the display substrate comprising an LCD array substrate or an OLED array substrate.

18. A method for detecting a display substrate according to claim 1, comprising an undesirable-display detection stage and a crack detection stage, wherein
in the undesirable-display detection stage, controlling the switching voltage supply circuit to output a first switching voltage to the control electrode of the switching transistor; and controlling the data voltage supply circuit to output a first data voltage to the second electrode of the switching transistor so that the switching transistor operates in a linear region, so as to detect whether there is a defect in the display of the display substrate;
in the crack detection stage, controlling the switching voltage supply circuit to output a second switching voltage to the control electrode of the switching transistor, and controlling the data voltage supply circuit to output a second data voltage to the second electrode of the switching transistor, so that the switching transistor operates in a saturation region, so as to detect whether there is a crack in the crack detecting wire.

19. The method according to claim 18, wherein the display area is provided with a pixel driving circuit therein, and the pixel driving circuit comprises a driving transistor, and the crack detection stage further comprises:
supplying a first power supply voltage to the second electrode of the driving transistor, so that the driving transistor operates in the saturation region.

20. A display device, comprising the display substrate according to claim 1.

* * * * *